US012754209B2

(12) United States Patent
Franco et al.

(10) Patent No.: US 12,754,209 B2
(45) Date of Patent: Oct. 6, 2026

(54) SHIELDED FINE-PITCH HIGH-PERFORMANCE IMPEDANCE TUNABLE INTERCONNECT

(71) Applicant: Intel Corporation, Santa Clara, CA (US)

(72) Inventors: Ismael Franco, Milwaukie, OR (US); Daqiao Du, Lake Oswego, OR (US); Brian Deford, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 342 days.

(21) Appl. No.: 17/728,174

(22) Filed: Apr. 25, 2022

(65) Prior Publication Data

US 2022/0244291 A1 Aug. 4, 2022

(51) Int. Cl.
*G01R 1/04* (2006.01)
*B33Y 80/00* (2015.01)

(52) U.S. Cl.
CPC ............ *G01R 1/0433* (2013.01); *B33Y 80/00* (2014.12)

(58) Field of Classification Search
CPC ...... G01R 1/04–07392; G01R 31/2808; G01R 31/2863; G01R 31/2865; B33Y 80/00
See application file for complete search history.

(56) References Cited

U.S. PATENT DOCUMENTS

2006/0284634 A1* 12/2006 Wu ...................... G01R 1/0466 324/756.02
2010/0041251 A1* 2/2010 Nakayama ......... H01R 13/2421 439/65
2016/0356842 A1* 12/2016 Lee ........................ G01R 1/045

FOREIGN PATENT DOCUMENTS

KR 102059515 B1 * 12/2019 ............... G01R 3/00

OTHER PUBLICATIONS

Machine translation of KR-102059515-B1 (Year: 2019).*
Xie et al., "3D-printed integrative probeheads for magnetic resonance", Nature Communications (Year: 2020).*

* cited by examiner

*Primary Examiner* — Lee E Rodak
*Assistant Examiner* — Jeremiah J Barron
(74) *Attorney, Agent, or Firm* — Nicholson De Vos Webster & Elliott LLP

(57) ABSTRACT

An apparatus and method for adjusting differential impendence of pins in a socket are described. A socket or test system includes a pin assembly that contains a pin block and pins. The pin block is formed from a material having a first permittivity. The pins include differential pin pairs with a fine pitch and provide electrical contact to an electronic package disposed on the pin block. A volume between each pin of the differential pin pairs or between adjacent pin pairs have a second permittivity that is different than the first permittivity. The volume is filled with air or one or more materials (or air) whose combined permittivity reduces or increases the differential impendence.

17 Claims, 7 Drawing Sheets

SHIELDED FINE-PITCH HIGH-PERFORMANCE IMPEDANCE TUNABLE INTERCONNECT

TECHNICAL FIELD

Embodiments pertain to electronic systems. In particular, some embodiments relate to impedance tuning of an electronic interconnect in an electronic system.

BACKGROUND

The ever-increasing desire for fast performance continues to drive advances in software and hardware for individual devices or at the platform level. Such advances include those directed to communication data rate increases and increased processing speeds, which may be achieved for example by increased communication speeds (internal or external) and increased communication density. The increased communication density may cause problems with the associated interconnects, in particular with the signal integrity in fine pitch (less than about 0.5 mm) interconnects due to impedance mismatch.

BRIEF DESCRIPTION OF THE FIGURES

In the figures, which are not necessarily drawn to scale, like numerals may describe similar components in different views. Like numerals having different letter suffixes may represent different instances of similar components. The figures illustrate generally, by way of example, but not by way of limitation, various embodiments discussed in the present document.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
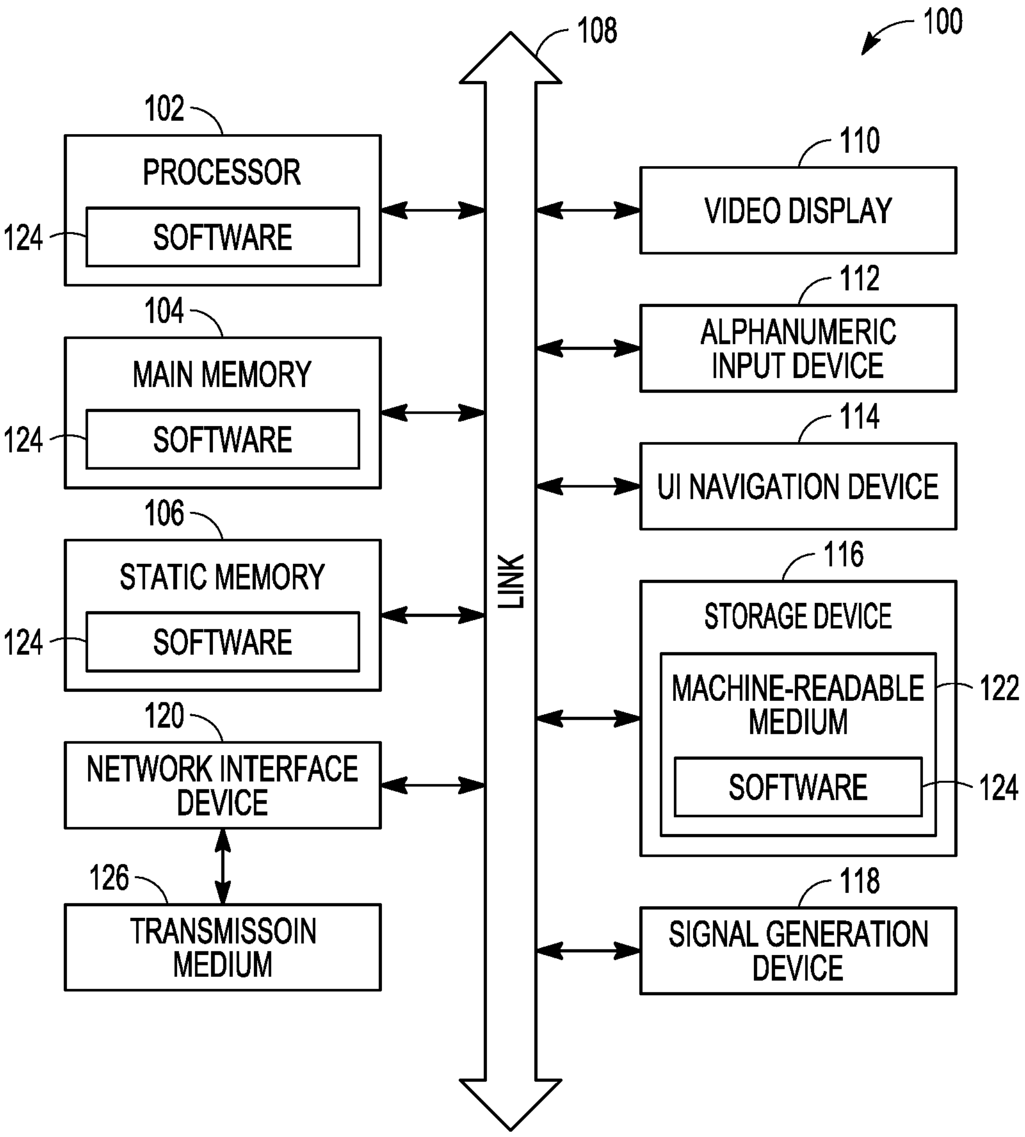
FIG. 1 illustrates a block diagram of a communication device in accordance with some embodiments.

FIG. 1 illustrates a block diagram of a communication device in accordance with some embodiments. The communication device 100 may use the socket described herein and/or one or more chips of the communication device 100 may be tested using the socket described herein. The communication device 100 may be a user equipment (UE) such as a specialized computer, a personal or laptop computer (PC), a tablet PC, or a smart phone, or network equipment such as an NodeB, a server running software to configure the server to, e.g., operate as a network device, or any machine capable of executing instructions (sequential or otherwise) that specify actions to be taken by that machine. Note that although FIG. 1 is shown as a communication device, the embodiments described herein may apply to any electronic device that uses a circuit board.

Examples, as described herein, may include, or may operate on, logic or a number of components, modules, or mechanisms. Modules and components are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" (and "component") is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

The communication device 100 may include a hardware processor (or equivalently processing circuitry) 102 (e.g., a central processing unit (CPU), a GPU, a hardware processor core, or any combination thereof), a main memory 104 and a static memory 106, some or all of which may communicate with each other via an interlink (e.g., bus) 108. The main memory 104 may contain any or all of removable storage and non-removable storage, volatile memory or non-volatile memory. The communication device 100 may further include a display unit 110 such as a video display, an alphanumeric input device 112 (e.g., a keyboard), and a user interface (UI) navigation device 114 (e.g., a mouse). In an example, the display unit 110, input device 112 and UI navigation device 114 may be a touch screen display. The communication device 100 may additionally include a storage device (e.g., drive unit) 116, a signal generation device 118 (e.g., a speaker), a network interface device 120, and one or more sensors, such as a global positioning system (GPS) sensor, compass, accelerometer, or other sensor. The communication device 100 may further include an output controller, such as a serial (e.g., universal serial bus (USB)), parallel, or other wired or wireless (e.g., infrared (IR), near field communication (NFC), etc.) connection to communicate or control one or more peripheral devices (e.g., a printer, card reader, etc.).

The storage device 116 may include a non-transitory machine readable medium 122 (hereinafter simply referred to as machine readable medium) on which is stored one or more sets of data structures or instructions 124 (e.g., software) embodying or utilized by any one or more of the techniques or functions described herein. The instructions 124 may also reside, completely or at least partially, within the main memory 104, within static memory 106, and/or within the hardware processor 102 during execution thereof by the communication device 100. While the machine readable medium 122 is illustrated as a single medium, the term "machine readable medium" may include a single medium or multiple media (e.g., a centralized or distributed database, and/or associated caches and servers) configured to store the one or more instructions 124.

The term "machine readable medium" may include any medium that is capable of storing, encoding, or carrying instructions for execution by the communication device 100 and that cause the communication device 100 to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks.

The instructions 124 may further be transmitted or received over a communications network using a transmission medium 126 via the network interface device 120 utilizing any one of a number of wireless local area network (WLAN) transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), and wireless data networks. Communications over the networks may include one or more different protocols, such as Institute of Electrical and Electronics Engineers (IEEE) 802.11 family of standards known as Wi-Fi, a Long Term Evolution (LTE) family of standards, a Universal Mobile Telecommunications System (UMTS) family of standards, peer-to-peer (P2P) networks, and a next generation (NG)/5$^{th}$ generation (5G) standards, among others. In an example, the network interface device 120 may include one or more physical jacks (e.g., Ethernet, coaxial, or phone jacks) or one or more antennas to connect to the transmission medium 126.

Note that the term "circuitry" as used herein refers to, is part of, or includes hardware components such as an electronic circuit, a logic circuit, a processor (shared, dedicated, or group) and/or memory (shared, dedicated, or group), an Application Specific Integrated Circuit (ASIC), a field-programmable device (FPD) (e.g., a field-programmable gate array (FPGA), a programmable logic device (PLD), a complex PLD (CPLD), a high-capacity PLD (HCPLD), a structured ASIC, or a programmable SoC), digital signal processors (DSPs), etc., that are configured to provide the described functionality. In some embodiments, the circuitry may execute one or more software or firmware programs to provide at least some of the described functionality. The term "circuitry" may also refer to a combination of one or more hardware elements (or a combination of circuits used in an electrical or electronic system) with the program code used to carry out the functionality of that program code. In these embodiments, the combination of hardware elements and program code may be referred to as a particular type of circuitry.

The term "processor circuitry" or "processor" as used herein thus refers to, is part of, or includes circuitry capable of sequentially and automatically carrying out a sequence of arithmetic or logical operations, or recording, storing, and/or transferring digital data. The term "processor circuitry" or "processor" may refer to one or more application processors, one or more baseband processors, a physical central processing unit (CPU), a single- or multi-core processor, and/or any other device capable of executing or otherwise operating computer-executable instructions, such as program code, software modules, and/or functional processes.

Any of the radio links described herein may operate according to any one or more of the following radio communication technologies and/or standards including but not limited to: a Global System for Mobile Communications (GSM) radio communication technology, a General Packet Radio Service (GPRS) radio communication technology, an Enhanced Data Rates for GSM Evolution (EDGE) radio communication technology, and/or a Third Generation Partnership Project (3GPP) radio communication technology (such as 4G, 5G, or 6G), Zigbee, Bluetooth, Wireless Gigabit Alliance (WiGig) standard, mmWave standards in general (wireless systems operating at 10-300 GHz and above such as WiGig, IEEE 802.11ad, IEEE 802.11ay, etc.), technologies operating above 300 GHz and THz bands, (3GPP/LTE based or IEEE 802.11p or IEEE 802.11bd and other) Vehicle-to-Vehicle (V2V) and Vehicle-to-X (V2X) and Vehicle-to-Infrastructure (V2I) and Infrastructure-to-Vehicle (I2V) communication technologies, 3GPP cellular V2X, or DSRC (Dedicated Short Range Communications) communication systems such as Intelligent-Transport-Systems and others.

Aspects described herein can be used in the context of any spectrum management scheme including dedicated licensed spectrum, unlicensed spectrum, license exempt spectrum, (licensed) shared spectrum. Applicable spectrum bands include the IMT spectrum as well as other types of spectrum/bands, such as bands with national allocation, spectrum made available under FCC's "Spectrum Frontier" 5G initiative (including 27.5-28.35 GHz, 29.1-29.25 GHz, 31-31.3 GHz, 37-38.6 GHz, 38.6-40 GHz, 42-42.5 GHz, 57-64 GHz, 71-76 GHz, 81-86 GHz and 92-94 GHz, etc), Intelligent Transport Systems (ITS) band of 5.9 GHz (typically 5.85-5.925 GHz) and 63-64 GHz, bands currently allocated to WiGig such as WiGig Band 1 (57.24-59.40 GHz), WiGig Band 2 (59.40-61.56 GHz) and WiGig Band 3 (61.56-63.72 GHz) and WiGig Band 4 (63.72-65.88 GHz), 57-64/66 GHz. Furthermore, the scheme can be used on a secondary basis on bands such as the TV White Space bands (typically below 790 MHz) where in particular the 400 MHz and 700 MHz bands are promising candidates. Besides cellular applications, specific applications for vertical markets may be addressed such as Program Making and Special Events (PMSE), medical, health, surgery, automotive, low-latency, drones, etc. applications.

In other embodiments, the embodiments described herein may be used to test components in a server system. In any case, as above, systems or devices that use, or are to be tested, using sockets with fine pitch interconnects for differential pin pairs (in which one of a pair of adjacent pins carries a positive signal and the other carries a corresponding negative signal) may have issues that arise due to impedance mismatch between the second level interconnect (SLI) (e.g., the socket that is connected to the PCB) and the channel to which the socket is connected, and through which signals are carried to a receiver. The pins may be, for example, landing grid array (LGA) pins. The mismatch may increase signal reflection and losses, reducing the overall transmission length using a particular link budget. The link budget is an accounting of all of the gains and losses from a transmitter through the transmission medium to the receiver.

Figure 2:
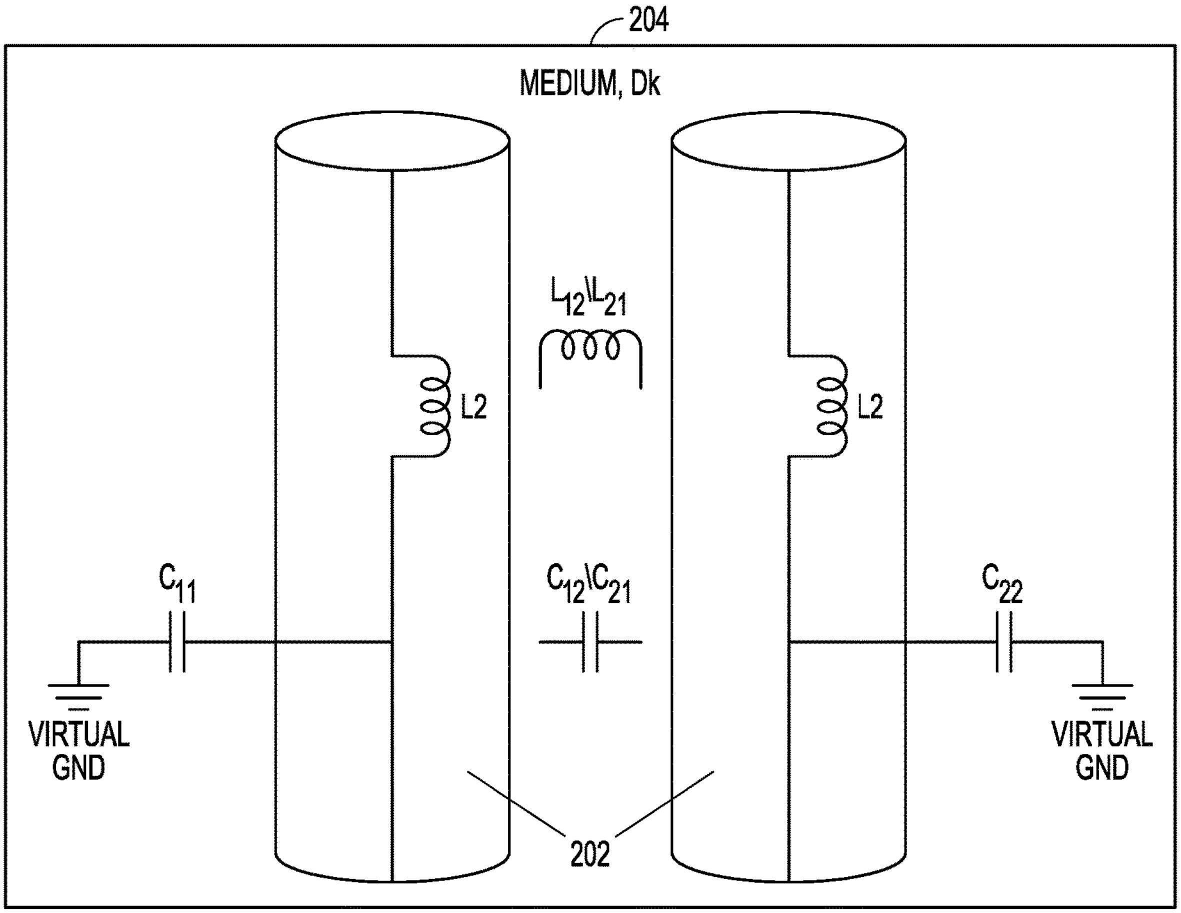
FIG. 2 illustrates lumped element parasitics model for adjacent conductors in accordance with accordance with some embodiments.

FIG. 2 illustrates lumped element parasitics model for adjacent conductors (in this case pins) in accordance with accordance with some embodiments. As shown, the differential conductor pair (pins) 202 are disposed within a non-conductive medium 204 having a dielectric constant (Dk) or relative permittivity (Er). A typical Dk value is 4 (FR4 epoxy), while a low Dk may be about 2 or closer to a vacuum (Dk=1). Each pin has an associated self-capacitance ($C_s$=$C_{11}$ or $C_{22}$) and inductance ($L_s$=$L_{11}$ or $L_{22}$). The pair 202 has a mutual capacitance ($C_m$=$C_{12}$ or $C_{21}$) and inductance ($L_m$=$L_{12}$ or $L_{21}$). The mutual capacitance and mutual inductance between pins are able to combine in a way that can drastically impact the differential characteristic impedance value ($Z_{odd}$) and thus the differential impedance ($Z_{Diff}$):

$$Z_{odd} = \sqrt{\frac{L_s - L_m}{C_s + 2 \cdot C_m}} \tag{1}$$

$$Z_{Diff} = 2 \cdot Z_{odd} \tag{2}$$

$$C = \varepsilon_r \frac{A}{d} \tag{3}$$

Although the last equation is the capacitance of a parallel plate capacitor, and the parasitic characteristics in a socket pin structure are more complex, it is a reasonable approximation to use for analysis. As is clear from the above equations, the differential impedance decreases with decreasing distance (d) between the conductors. Because the channel has a target differential impedance, this decreasing differential impedance causes an increasing impedance mismatch with decreasing pitch. One of the system effects of the decreasing pitch of the pins of a package without modification is that, for a given electrical link budget, the total channel length of the system is reduced with decreasing pitch of the conductors and associated interconnects. This, however, can further impact the already-severe design constraints for device placement and interconnect routing, adding further complexity and cost. In an example in which the target differential impedance is about 85 ohms and the actual differential impedance may be reduced to roughly 40 ohms, resulting in a pronounced discontinuity in the channel that reduces the potential maximum routing length by about 1.7"—a significant amount in circuit layout design. Alternatively, to reduce the intra-pair coupling impact of the interconnect/socket interface, the pitch of the package balls may be increased, creasing the package footprint. Increasing the package footprint uses increased real estate of the PCB, which is exceedingly limited. If neither of these options are used, then the interface is operated at a lower speed to maintain the budget (the data rate of the affected interface is de-rated), reducing the computational power available and increasing computation times.

To this end, the embodiments herein counteract the decreasing differential impedance and benefit single-ended impedance tuning. Return loss and insertion loss are controlled to better than −10 dB and −0.5 dB (respectively) for a 3.6 mm pin at 0.4 mm pitch at 10 GHz. In particular, undesired pin-to-pin capacitive coupling at fine pitches may be compensated for to adjust the differential impedance to better match the target impedance of the channel. By adjusting the interconnect properties, far-end crosstalk (FEXT) and/or near-end crosstalk (NEXT) crosstalk can be better managed even for single-ended interfaces. For example, the magnetic coupling can be "guided" (return current optimization) between a particular pair of pins to reduce their overall FEXT.

This embodiments can be applied, e.g., in the form of a standard original equipment manufacturer (OEM) socket or as a high volume manufacturable (HVM) test socket. The socket may be able to support standard PCB/routing lengths for high speed interfaces such as Thunderbolt3 (20 Gbps) or PCIe5 (32 Gbps) or PCIe6 (64 Gbps).

As above, while the parasitic capacitance is roughly inversely dependent on the distance between the socket pins, the parasitic capacitance is also dependent on the dielectric constant of the material between the pins. That is, by lowering the effective permittivity $\varepsilon_r$ of the pin housing material, the parasitic capacitance may be reduced per equation (3), thereby increasing the differential impedance per equation (1)/(2).

The effective permittivity $\varepsilon_r$ of the pin housing may be reduced by increasing the package size, increasing the air gap between coupled pins of a differential pin pair or between different pin pairs, and/or by selectively reducing the dielectric constant of the solid material in areas around the differential pin pair. In general, a combination of both the use of low dielectric constant materials and the addition of cavities in which air is present instead of a solid material, may be used. This may be used for reducing not only the inter-pair coupling $C_m$, but in addition coupling from the pins to an adjacent Vss pin (ground), $C_s$, in order to improve the pins performance.

Figure 3A:
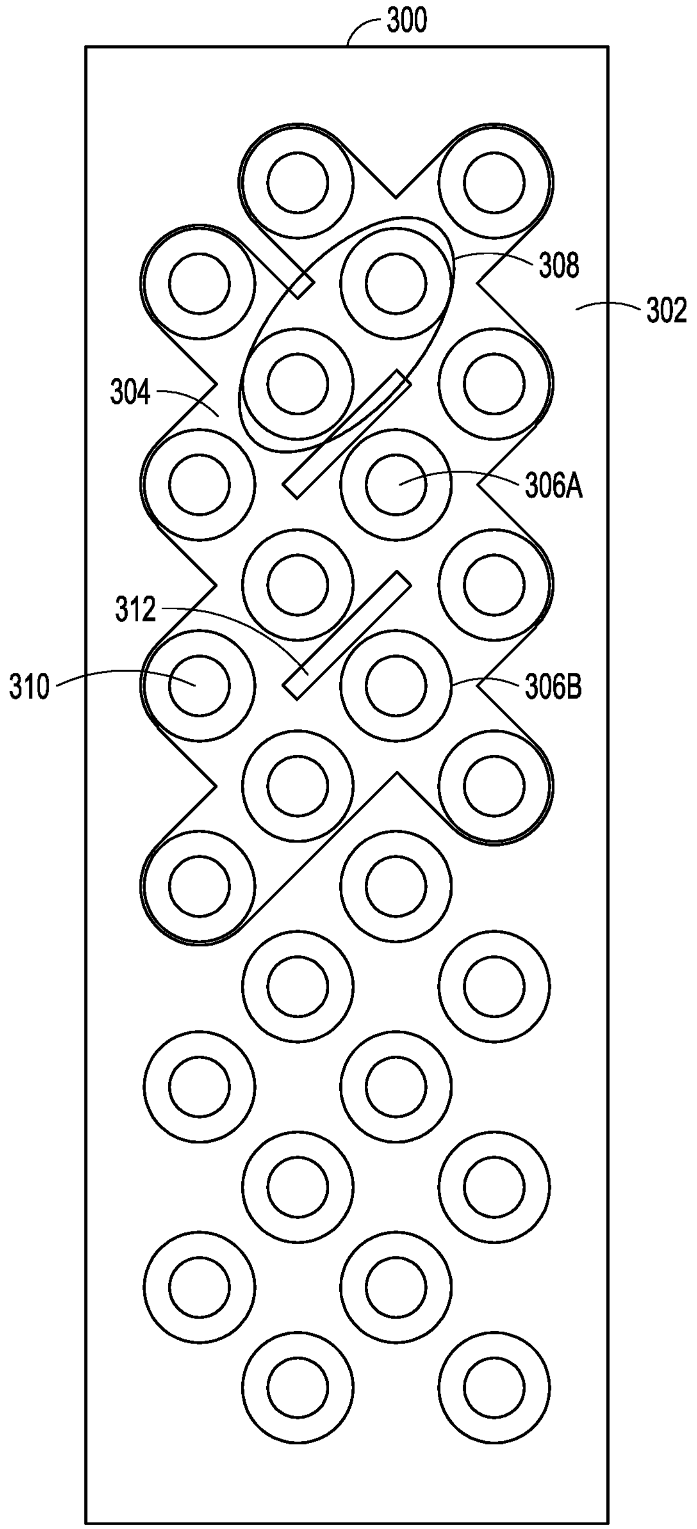
FIG. 3A illustrates a top view of a pin block in accordance with some embodiments.
Figure 3B:
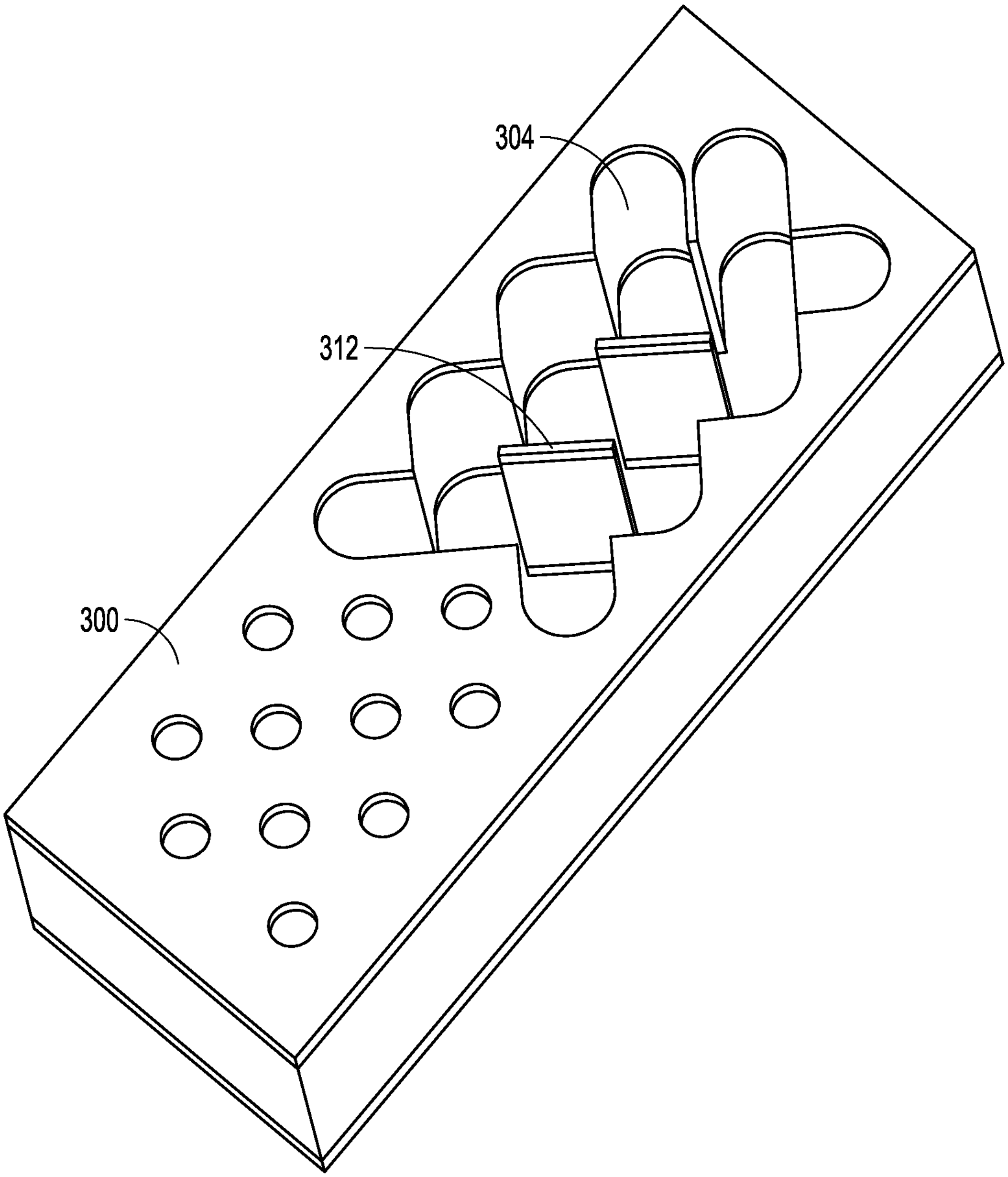
FIG. 3B illustrates an isometric view of the pin block of FIG. 3A in accordance with some embodiments.

FIG. 3A illustrates a top view of a pin block in accordance with some embodiments. FIG. 3B illustrates an isometric view of the pin block of FIG. 3A in accordance with some embodiments. As shown in FIGS. 3A and 3B, the pin block 300 has a housing 302 formed from a material of a first dielectric constant. The housing 302 has a cavity 304 formed therein. In some embodiments, a solid block of housing material may have material removed by one or more mechanical processes, such as drilling or dremelling, to form the cavity 304.

Pins may be placed in a regular lattice at predetermined locations in the cavity 304. The pins may include, among others, differential pins 306*a*, which form part of a differential pin pair 308, and ground (or power or other signal) pins 310 that provide ground and isolation to the chip inserted into the pin block 300. The differential pins 306*a* may have a (center-center) pitch, for example, of less than about 0.5 mm (e.g., 0.4 mm). The pins 306*a*, 310 may be formed from a conductor (e.g., metal). The pins 306*a*, 310 may extend vertically through the entire pin block 300 or may have a portion that is bent to contact landing pads of the chip inserted therein. The pins 306*a*, 310 may be surrounded by an air buffer 306*b* that is the same size or larger than the diameter of the pins 306*a*, 310. The air buffer 306*b* is a deliberately excavated layer that extends significantly further than a limited (mandatory) gap used for tolerance between the pins 306*a*, 310 and existing material surrounding the pins 306*a*, 310 to allow insertion of the pins 306*a*, 310 into the structure. The differential pin pairs 308 may include high speed (e.g., 20 GB/s) transmission (TX) and reception (RX) differential pin pairs. Other low speed differential pin pairs may be present. Whether or not the pins of the specific differential pin pairs are separated by air and/or from other differential pin pairs may depend on the operational speed of the differential pin pair use. In addition, the presence of the cavity 304 may be dependent on the pin geometry (e.g., the size of the probe tip). The pins (e.g., of the differential pin pairs) may be separated, for example, from about 200 μm to about 1 mm.

Figure 3C:
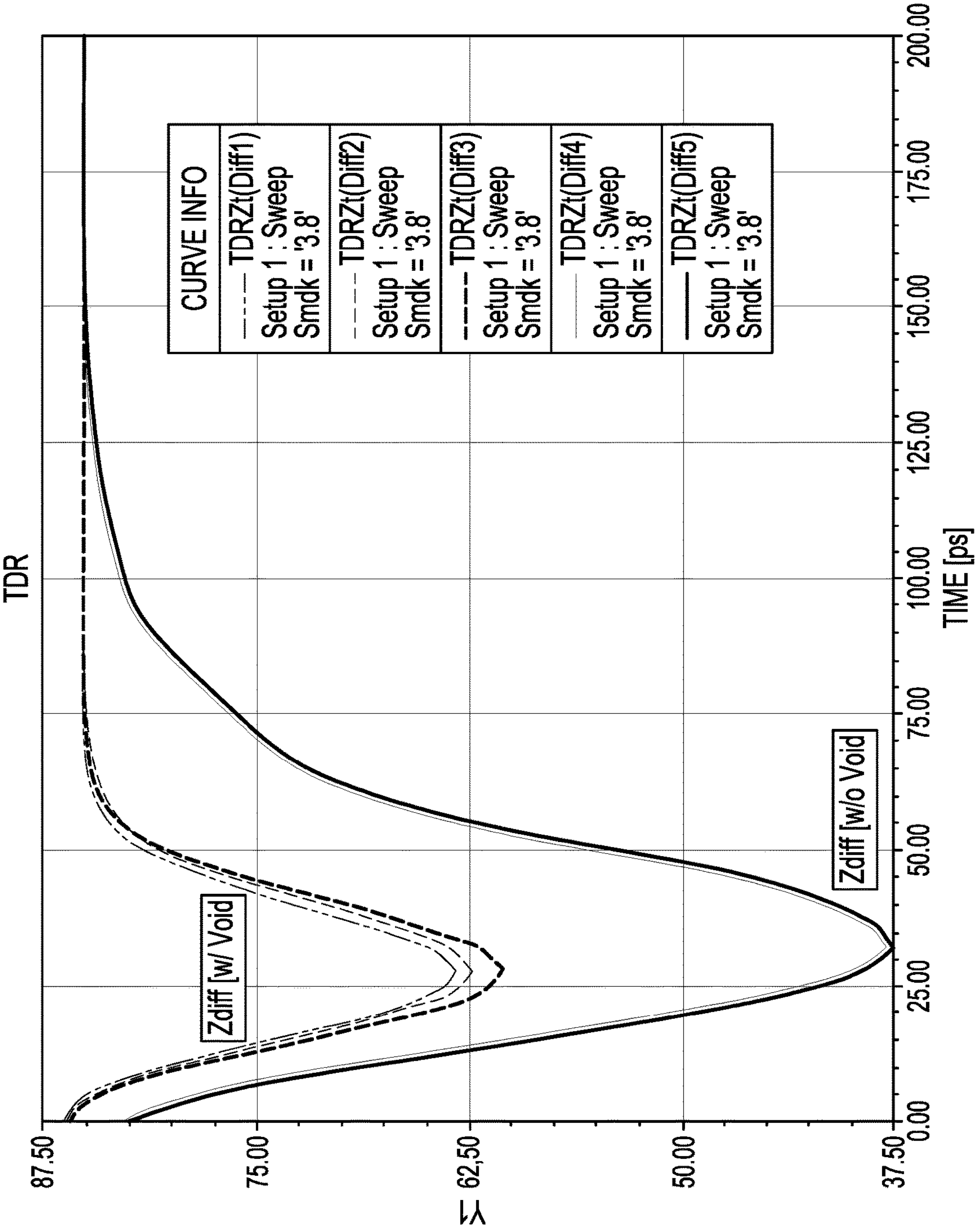
FIG. 3C illustrates a plot of differential impedance in accordance with some embodiments.

FIG. 3C illustrates a plot of differential impedance in accordance with some embodiments. Specifically, FIG. 3C shows a Time Domain Reflectometry (TDR) plot, in which a low voltage pulse is introduced to the system that includes the pin block and the time between the introduction and return of the low voltage pulse from any reflections is measured. As shown, compared with a solid pin block, whose differential impedance decreases to about 37.5 ohms, the differential impedance of a differential pin pair surrounded by air in FIG. 3A is increased to about 62.5 ohms, resulting in a smaller overall impact from the test socket to the channel. This translates to a reduction in the maximum routing only by 0.18" (62.5 ohms) vs. 1.7" (for 37.5 ohms), almost an order of magnitude improvement and improving the design layout ability.

In some embodiments, the effective permittivity between the pins 306*a* of the differential pin pair 308 and between adjacent differential pin pairs 308 may be the same. In other embodiments, the effective permittivity between the pins 306*a* of the differential pin pair 308 and between adjacent differential pin pairs 308 may be different. For example, while the pins 306*a* of the differential pin pair 308 may be separated only by air, the adjacent differential pin pairs 308 may be separated by a wall of material 312 in addition to the air buffer 306*b*. In some embodiments, the pin housing 302 may be formed from a shielding material (i.e., a conductor) and may have a thin non-conductive layer surrounding the pin (not shown) and the air gaps engineered and optimized around groups of pins or optimized around each individual pin. By adjusting the voiding and or material properties of the medium surrounding a pin or set of pins, the pin(s) characteristic impedance may be adjusted. If this impedance is tuned to match the channel impedance ("optimized"), then the signal reflections may be mitigated or eliminated, and the FEXT can be reduced. This optimized tuning can be applied at the individual pin level to achieve desired impedance at a specific pin location. So, the voiding and material can vary by pin location. For power/GND pin groups, the impedance may be designed to be as low as possible since adding capacitance helps with power delivery.

In other embodiments, after forming the cavity 304, volumes that include those for the pins 306*a*, 310 and air buffer 306*b* may be filled with a solid material having a dielectric constant different from that of the housing 302. This permits the impedance to be more easily tailored to a specific differential impedance by selection of a filling material with the appropriate dielectric constant. This may also permit the differential impedance to be decreased by filling the cavity 304 with a material having a higher dielectric constant than the material of the pin housing 302.

Figure 4:
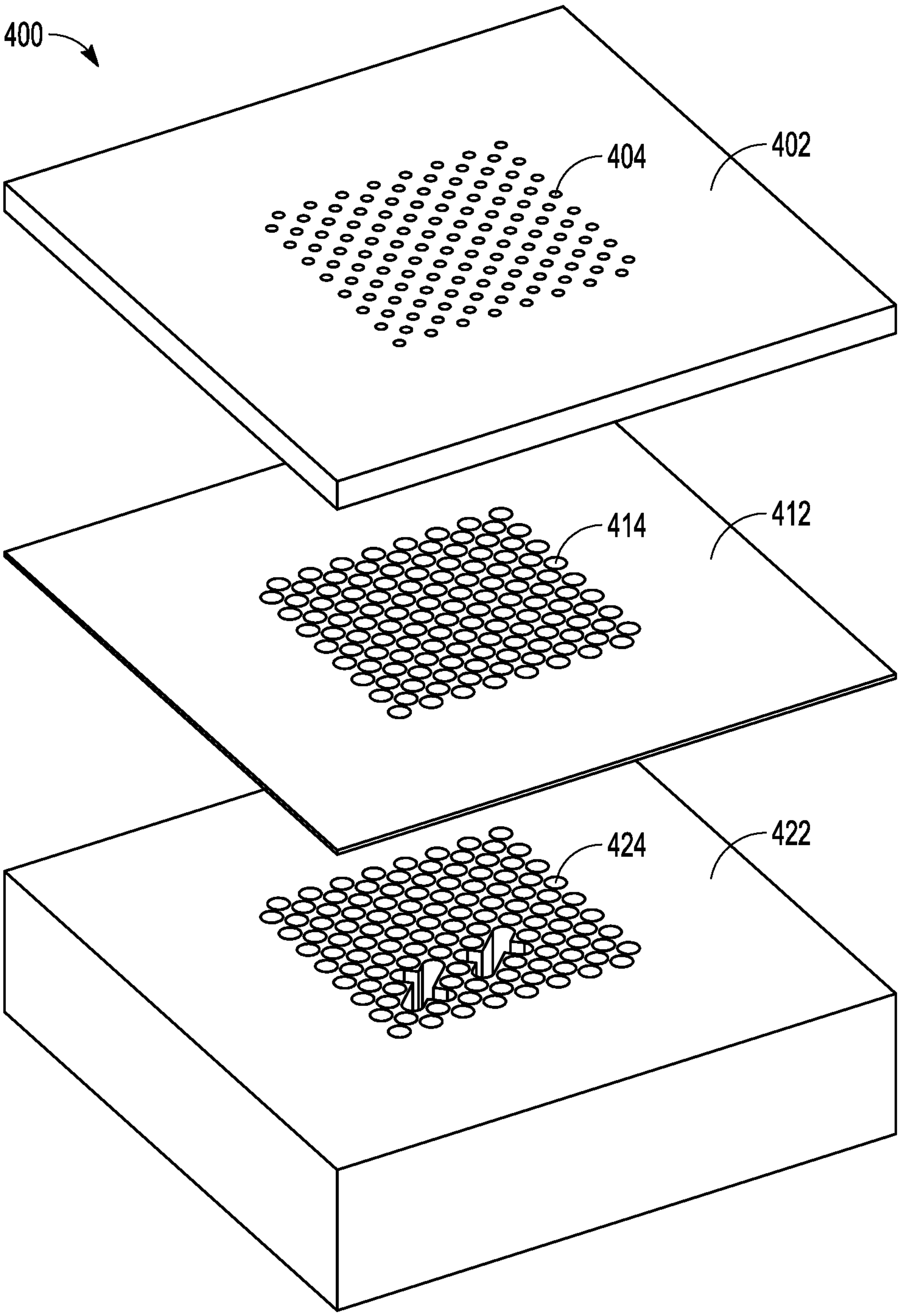
FIG. 4 illustrates an exploded isometric view of a pin assembly according to some embodiments.

The formation of a cavity 304, however, may result in mechanical instability for the pins, however. FIG. 4 illustrates an exploded isometric view of a pin assembly according to some embodiments. As shown in FIG. 4, the pin assembly 400 may contain multiple layers. In addition to the pin block 422 containing the cavity 424 (shown in FIGS. 3A and 3B), a pin retainer 402, and shim 412 may be formed. One end of the pins may be disposed in the cavity of the pin block 422, with the other end of the pins extending through holes 404 in the pin retainer 402 to couple to landing pads of a package disposed on the pin assembly 400 (for use or testing). The pin block 422 and the pin retainer 402 may be formed from shielding materials (conductors). The shielded material can be left floating (unconnected to any of the pins) or can be shorted to power or Vss (or GND) pins depending on the application. In embodiments in which the conductive shielding material is shorted to the VSS pins of the device being socketed, this may provide adjacent/localized return path for each signal limiting magnetic field coupling via shared return paths. It also reduces electric field coupling by providing a local termination for the signal's electric field lines. If the pin block 422 is plastic, then the electromagnetic fields radiate out from the signal to the nearby pins, increasing the cross-talk.

To add mechanical stability, one or more (very thin) shims 412 may be disposed between the pin block 422 and the pin retainer 402. The shims 412 may have holes 414 disposed therein through which the pins extend. The shims 412 may be separated from each other and/or from the pin block 422 and the pin retainer 402 by separators at the edges of the various layers. The socket formed using the pin assembly 400 may have a floating base (e.g., a bearing system provides a floating fulcrum for mechanical motion to enable contact) in some embodiments, or may not have a floating base in other embodiments.

Thus, the bottom of the pin can be supported within the pin block 422 if the voiding does not extend all the way through the pin block 422. Alternatively, there can be a separate thin shim 412 below the pin block 422 to hold the pin in place. As shown, the pin block 422 should be the thickest layer. For example, in a 3.6 mm tall socket, the pin block 422 may be about 3 mm thick, and the shims may be about 100 μm to 200 μm, with the balance eft for the floating base.

Figure 5:
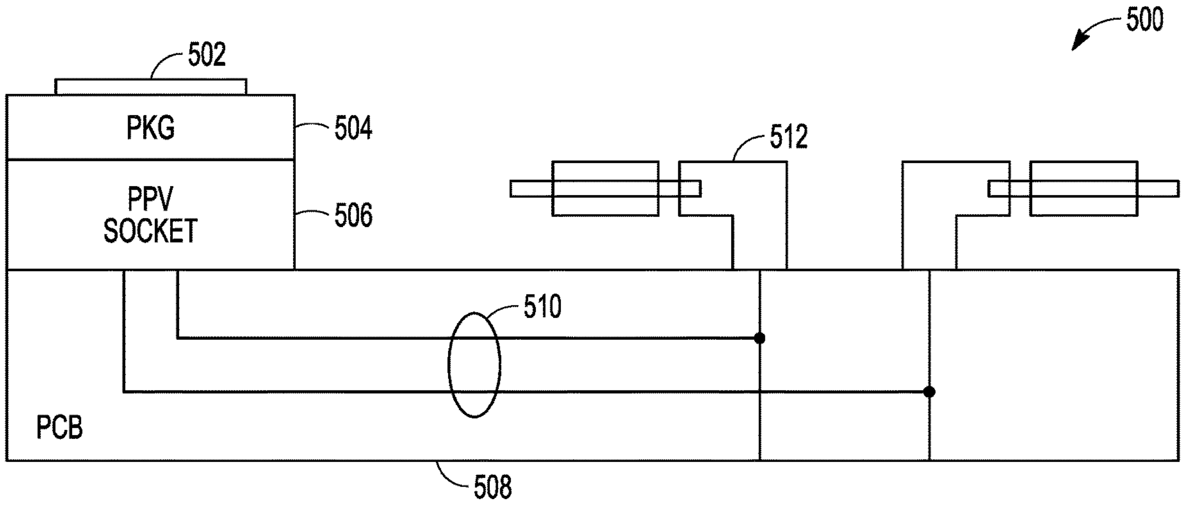
FIG. 5 illustrates a simplified cross-sectional view of a system according to some embodiments.

FIG. 5 illustrates a simplified cross-sectional view of a system according to some embodiments. The system 500 includes an electronic chip 502 disposed in a package 504. The package 504 is inserted into the socket 506 that contains the pin assembly described in FIGS. 3A, 3B, and 4. The socket 506 sits on a PCB 508 and electrically connects differential pin pairs of the package 504 to routing 510 on the PCB 508. The PCB 508 connects to a receiver through an external connector 512, although the receiver may also be located on the PCB 508 and the connector may be internal rather than external. The system 510 may be used for testing the chip 502 under various operating conditions for when the chip 502 is finally attached to a final product or may be a part of the final product.

Figure 6:
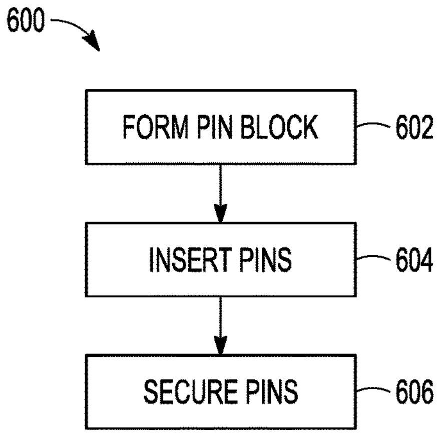
FIG. 6 illustrates a method of fabricating a pin assembly according to some embodiments.

FIG. 6 illustrates a method of fabricating a pin assembly according to some embodiments. The method 600 of FIG. 6 may provide operations related to formation of the system 500 shown in FIG. 5; additional operations may be present. In addition, the operations may be performed in an order different from that shown. At operation 602, a pin block may be formed with a cavity such as that described above. In some embodiments, a solid block of housing material may have material removed by one or more mechanical processes, such as drilling or dremelling. Alternatively, or in addition, one or more chemical processes, such as etching, may be used to form the cavity from the block of material. In other embodiments, the pin block may be formed by three dimensional printing, e.g., printing alternating thin layers of material of the housing and hollow layers to yield an effective $\varepsilon_r$ value closer to 1. In other embodiments, only portions of the solid material may be excavated around the pins, dependent for example on the functionality of the pins to be used. In some embodiments, the solid material may be removed from around some of the pins (in whole or part between a particular pin and an adjacent pin) and essentially not be removed from around other pins.

At operation 604, pins may be inserted into the pin block. The pins may be inserted in a predetermined pattern and may include individual pins of differential pairs disposed in predetermined locations, as well as ground pins, among others. The differential pairs may be diagonally adjacent to each other. The pins may be vertically positioned or a portion of the pins may be angled with respect to the vertical direction (from the bottom of the pin block to the top of the pin block).

Prior to, or after the first pins have been attached to the pin block, at operation 606 the remaining layers may be added to complete the pin assembly and secure the pins. The remaining layers may include a top pin retainer and may further include one or more shim layers to provide mechanical stability to the pins. After completion of the pin assembly into a socket, the structure may be attached to, or otherwise used to couple an electronic package to a PCB for use or testing of the electronic package.

EXAMPLES

Example 1 is an apparatus for a pin assembly, the apparatus comprising: a pin block formed from a material having a first permittivity; and pins disposed in the pin block in a lattice of predetermined fine pitch locations, the pins extending completely through the pin block to provide electrical contact to an electronic package disposed on the pin block, the pins including differential pin pairs, a volume in the pin block having a second permittivity that is less than the first permittivity to reduce a differential impendence of at least some of the differential pin pairs, wherein the volume is disposed between at least some of adjacent pins in the pin block.

In Example 2, the subject matter of Example 1 further includes that the volume is disposed between pins of at least one of the differential pin pairs.

In Example 3, the subject matter of Examples 1-2 further includes that the volume is disposed between adjacent differential pin pairs.

In Example 4, the subject matter of Examples 1-3 further includes that the volume is substantially entirely filled with a substance having the second permittivity.

In Example 5, the subject matter of Examples 4 further includes that the second permittivity is about 1.

In Example 6, the subject matter of Examples 1-5 further includes that: the volume is partially filled with air and partially filled with a solid, and a volume adjacent to each pin of the differential pin pairs is filled with air and a volume between the air is filled with the solid.

In Example 7, the subject matter of Examples 1-6 further includes that: the volume is partially filled with air and partially filled with a solid, and the solid is the material of the pin block.

In Example 8, the subject matter of Examples 1-7 further includes that: the volume is partially filled with air and partially filled with a solid, and the solid is a material has a permittivity between the first permittivity and permittivity of air.

In Example 9, the subject matter of Examples 1-8 further includes that: the pin block comprises a cavity in which the pins are disposed, the cavity defined by walls connected by a base that retains one end of the pins, and the apparatus further comprises: a pin retainer configured to retain another end of the pins, and a shim disposed between the pin block and the pin retainer, the shim configured to provide mechanical support for the pins.

In Example 10, the subject matter of Examples 1-9 further includes that: the pin block is formed from a shielding material, and the volume is disposed between each pin of the differential pin pairs.

In Example 11, the subject matter of Examples 1-10 further includes that: the pin block is formed from a shielding material, and the volume is disposed between adjacent pin pairs of the differential pin pairs.

In Example 12, the subject matter of Examples 1-11 further includes that the volume is formed from alternating solid layers of the material and hollow layers of the material.

Example 13 is a testing system comprising: a socket configured to receive a chip package, the socket including: a pin block formed from a material having a first permittivity; and pins disposed in the pin block to contact an electronic package disposed on the pin block, the pins including pairs of differential pins, a volume in the pin block between at least some of the pins having a second permittivity that is different than the first permittivity to adjust a differential impendence of the at least some of the pins; and a printed circuit board (PCB) on which the socket is disposed, the PCB having a channel for electrically connecting the pins to a device under test.

In Example 14, the subject matter of Example 13 further includes that the volume is substantially entirely air.

In Example 15, the subject matter of Examples 13-14 further includes that a volume adjacent to each pin is filled with air and a volume between the air is filled with a solid having a permittivity between the first permittivity and permittivity of air.

In Example 16, the subject matter of Examples 13-15 further includes that the second permittivity is larger than the first permittivity and excavation of material around the pins in the pin block reduces a dielectric constant to increase the differential impedance of the pins to more closely match a channel impedance.

In Example 17, the subject matter of Examples 13-16 further includes that: the pin block comprises a cavity in which the pins are disposed, the cavity defined by walls connected by a base that retains one end of the pins, and the socket further comprises: a pin retainer configured to retain another end of the pins, and a shim disposed between the pin block and the pin retainer, the shim configured to provide mechanical support for the pins.

Example 18 is a method of fabricating a socket, the method comprising: forming a pin block from a material having a first permittivity, forming of the pin block comprising: providing fine pitch openings for pins to extend completely through the pin block at predetermined locations; and forming a volume between at least some of the openings to have a second permittivity that is less than the first permittivity; and inserting the pins into the openings to enable electrical contact to an electronic package.

In Example 19, the subject matter of Example 18 further includes that forming the volume between at least some of the openings to have a second permittivity that is less than the first permittivity comprises removing all of the material having the first permittivity from the volume by drilling away the material.

In Example 20, the subject matter of Examples 18-19 further includes that forming the pin block comprises printing alternating thin and hollow layers that contain the openings.

In Example 21, the subject matter of Examples 18-20 further includes that: the pin block is formed to have a cavity in which the pins are disposed, the cavity defined by walls connected by a base that retains one end of the pins, and the method further comprises: providing a pin retainer to retain another end of the pins, and providing mechanical support for the pins using a shim disposed between the pin block and the pin retainer.

Example 22 is at least one machine-readable medium including instructions that, when executed by processing circuitry, cause the processing circuitry to perform operations to implement of any of Examples 1-21.

Example 23 is an apparatus comprising means to implement of any of Examples 1-21.

Example 24 is a system to implement of any of Examples 1-21.

Example 25 is a method to implement of any of Examples 1-21.

Although an embodiment has been described with reference to specific example embodiments, it will be evident that various modifications and changes may be made to these embodiments without departing from the broader scope of the present disclosure. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

The subject matter may be referred to herein, individually and/or collectively, by the term "embodiment" merely for convenience and without intending to voluntarily limit the scope of this application to any single inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, UE, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus for a pin assembly, the apparatus comprising:

a pin block formed from a material having a first permittivity; and pins disposed in the pin block in a lattice of predetermined fine pitch locations, the pins extending completely through the pin block to provide electrical contact to an electronic package disposed on the pin block, the pins including differential pin pairs, wherein each differential pin pair has a first pin and a second pin extending in a first direction from the first pin, adjacent differential pin pairs in a second direction orthogonal to the first direction are separated by a rectangular wall that extends in the first direction, the rectangular wall separating the adjacent differential pin pairs in the second direction is limited in the first direction to separate only one pin of each of the adjacent differential pin pairs, differential pin pairs that are adjacent to each other in the first direction are separated by a medium having a single permittivity, and a region disposed between at least some adjacent pins within the pin block has an effective permittivity that is less than the first permittivity to reduce a differential impedance of at least some of the differential pin pairs.

2. The apparatus of claim 1, wherein:

the differential pin pairs include multiple adjacent differential pin pairs extending in the first direction, and only a subset of the multiple adjacent differential pin pairs is separated from corresponding differential pin pairs in the second direction by a corresponding rectangular wall.

3. The apparatus of claim 1, wherein pins of each of the differential pin pairs are separated by the medium having the single permittivity.

4. The apparatus of claim 1, wherein an air buffer extends in the second direction between the pins of the adjacent differential pin pairs and the rectangular wall.

5. The apparatus of claim 4, wherein:

non-conductive layer surrounds each of the pins of the adjacent differential pin pairs such that the non-conductive layer is disposed between the pin and the air buffer.

6. The apparatus of claim 4, wherein: the air buffer extends in the second direction entirely between each of the pins of the adjacent differential pin pairs and the rectangular wall.

7. The apparatus of claim 1, wherein: the rectangular wall has a permittivity between the first permittivity and permittivity of air.

8. The apparatus of claim 1, wherein: the pin block comprises a cavity in which the pins are disposed, the cavity defined by walls connected by a base that retains one end of the pins, and the apparatus further comprises:

a pin retainer configured to retain another end of the pins, and a shim disposed between the pin block and the pin retainer, the shim configured to provide mechanical support for the pins.

9. The apparatus of claim 8, wherein:

the apparatus comprises a plurality of shims separated from each other by a first separator disposed between edges of the plurality of shims, a first shim of the plurality of shims separated from the pin block by a second separator disposed between edges of the first shim and edges of the pin block, and a second shim of the plurality of shims separated from the pin retainer by a third separator disposed between edges of the second shim and edges of the pin retainer.

10. The apparatus of claim 1, wherein: the pin block is formed from a shielding material.

11. The apparatus of claim 1, wherein the pin block is formed from alternating solid layers of the material and hollow layers of the material.

12. A method of fabricating a socket, the method comprising:

forming a pin block from a material having a first permittivity, forming of the pin block comprising:

providing fine pitch openings for pins to extend completely through the pin block at predetermined locations;

forming a wall between at least some of the openings; and inserting the pins into the openings to enable electrical contact to an electronic package, wherein:

the pins include pins of differential pin pairs, each differential pin pair has a first pin and a second pin extending in a first direction from the first pin, adjacent differential pin pairs in a second direction orthogonal to the first direction are separated by a rectangular wall that extends in the first direction, the rectangular wall separating the adjacent differential pin pairs is limited in the first direction to separate only one pin of each of the adjacent differential pin pairs, differential pin pairs that are adjacent to each other in the first direction are separated by a medium having a single permittivity, and a region disposed between at least some adjacent pins within the pin block has an effective permittivity that is less than the first permittivity to reduce a differential impedance of at least some of the differential pin pairs.

13. The method of claim 12, wherein forming the pin block comprises printing alternating thin and hollow layers that contain the openings.

14. An apparatus for a pin assembly, the apparatus comprising:

a pin block formed from a material having a first permittivity; and pins disposed in the pin block in a lattice of predetermined fine pitch locations, the pins extending completely through the pin block to provide electrical contact to an electronic package disposed on the pin block, the pins including differential pin pairs, wherein the pins include:

a first differential pin pair extending in a first direction, a second differential pin pair extending in the first direction and adjacent to the first differential pin pair in the first direction, a third differential pin pair extending in the first direction, adjacent to the first differential pin pair in a second direction orthogonal to the first direction and adjacent to the second differential pin pair in the second direction, a fourth differential pin pair extending in the first direction, adjacent to the third differential pin pair in the first direction, and adjacent to the second differential pin pair in the second direction, the first differential pin pair and the third differential pin pair are separated by a wall-extending in the first direction, the wall is limited in the first direction to separate only one pin of each of the first differential pin pair and the third differential pin pair, the first differential pin pair and the second differential pin pair are separated by a medium having a single permittivity, and a region disposed between at least some adjacent pins within the pin block has an effective permittivity that is less than the first permittivity to reduce a differential impedance of at least some of the differential pin pairs.

15. The apparatus of claim 14, wherein:

centers of each pin of the first differential pin pair and the second differential pin pair are colinear, centers of each pin of the third differential pin pair and the fourth differential pin pair are colinear, and among the first, second, third, and fourth differential pin pairs, only the first differential pin pair and the third differential pin pair are separated by any wall.

16. The apparatus of claim 15, wherein:

a first air buffer encircles a first pin of the first differential pin pair, and a second air buffer encircles a first pin of the third differential pin pair.

17. The apparatus of claim 16, wherein:

the first air buffer extends in the second direction entirely between the first pin of the first differential pin pair and the wall, and the second air buffer extends in the second direction entirely between the first pin of the third differential pin pair and the wall.

* * * * *